(12) United States Patent
Hu et al.

(10) Patent No.: US 11,894,180 B2
(45) Date of Patent: Feb. 6, 2024

(54) CAPACITIVE VOLTAGE TRANSFORMER

(71) Applicant: SUZHOU APPARATUS SCIENCE ACADEMY CO., LTD., Jiangsu (CN)

(72) Inventors: Delin Hu, Jiangsu (CN); Chun Hu, Jiangsu (CN); Zhanbin Wang, Jiangsu (CN); Jie Li, Jiangsu (CN); Bing Yin, Jiangsu (CN); Ming Qian, Jiangsu (CN)

(73) Assignee: SUZHOU APPARATUS SCIENCE ACADEMY CO., LTD., Jiangsu (CN)

( * ) Notice: Subject to any disclaimer, the term of this patent is extended or adjusted under 35 U.S.C. 154(b) by 315 days.

(21) Appl. No.: 17/439,434

(22) PCT Filed: Jul. 3, 2020

(86) PCT No.: PCT/CN2020/100024
§ 371 (c)(1),
(2) Date: Sep. 15, 2021

(87) PCT Pub. No.: WO2021/248594
PCT Pub. Date: Dec. 16, 2021

(65) Prior Publication Data
US 2022/0223337 A1    Jul. 14, 2022

(30) Foreign Application Priority Data

Jun. 10, 2020 (CN) .......................... 202010521552.2

(51) Int. Cl.
*H01F 27/40* (2006.01)
*H01G 4/01* (2006.01)
(Continued)

(52) U.S. Cl.
CPC ............... *H01F 27/40* (2013.01); *H01G 4/01* (2013.01); *H01G 4/04* (2013.01); *H01G 4/258* (2013.01)

(58) Field of Classification Search
CPC ......... G01R 15/06; G01R 15/18; H01F 27/40; H01F 27/022; H01F 27/14; H01F 27/28;
(Continued)

(56) References Cited

U.S. PATENT DOCUMENTS 3,197,551 A * 7/1965 Linderholm ......... H01B 17/005
174/73.1
3,411,069 A * 11/1968 Kubler ..................... H01G 4/38
174/12 R
(Continued)

FOREIGN PATENT DOCUMENTS

CN          202678108 U    1/2013
CN          105092929 A    11/2015
(Continued)

*Primary Examiner* — Jay Patidar
(74) *Attorney, Agent, or Firm* — MUNCY, GEISSLER, OLDS & LOWE, P.C.

(57) ABSTRACT

The present invention provides a capacitive voltage transformer, including: a capacitive voltage-dividing component and an electromagnetic unit. The capacitive voltage-dividing component comprises: one or more levels of stacks, and each stack is a coupling capacitor. The coupling capacitor includes: an upper cover plate, a lower cover plate, an insulating sleeve, a capacitor core, squirrel cage electrodes, volume matching devices, a high voltage lead, and a low voltage lead. The lowermost coupling capacitor is provided with a medium voltage lead and a lead terminal. The low voltage lead of the lowermost coupling capacitor is led out through a low-voltage leading-out tube arranged in the lead terminal, and the medium voltage lead of the lowermost coupling capacitor is led out through a medium-voltage leading-out post arranged in the lead terminal. The medium-voltage leading-out post passes through and out of the low-voltage leading-out tube and is arranged coaxially with the low-voltage leading-out tube.

8 Claims, 6 Drawing Sheets

(51) Int. Cl.
*H01G 4/04* (2006.01)
*H01G 4/258* (2006.01)

(58) Field of Classification Search
CPC .... H01F 27/2828; H01F 27/29; H01F 27/324; H01F 27/34; H01F 38/26; H01G 4/01; H01G 4/04; H01G 4/258; H01G 4/22; H01G 4/224; H01G 4/232; H01G 4/38
See application file for complete search history.

(56) References Cited

U.S. PATENT DOCUMENTS

| | | | |
|---|---|---|---|
| 6,727,791 B2 * | 4/2004 | Zhou | H01F 30/10 336/20 |
| 9,714,957 B2 * | 7/2017 | Giovanelli | H03H 7/24 |
| 2003/0146815 A1 | 8/2003 | Zhou et al. | |

FOREIGN PATENT DOCUMENTS

| | | | |
|---|---|---|---|
| CN | 207282324 U | | 4/2018 |
| CN | 208672702 U | * | 3/2019 |
| CN | 109935460 A | | 6/2019 |

* cited by examiner

CAPACITIVE VOLTAGE TRANSFORMER

TECHNICAL FIELD

The present invention belongs to the technical field of voltage transformers, and specifically relates to a capacitive voltage transformer.

BACKGROUND

A capacitive voltage transformer for high-voltage power transmission is composed of a capacitive voltage-dividing component and an electromagnetic unit. The capacitive voltage-dividing component, according to the voltage level of a product, is composed of one or more levels of stacks, and the stacks are coupling capacitors that are stacked together to form the whole capacitive voltage-dividing component.

However, capacitances of the existing capacitive voltage transformers may change due to vibration or temperature variation during transportation, causing related products to have unstable capacitances.

SUMMARY

In order to solve the above-mentioned technical problem, the present invention proposes a capacitive voltage transformer.

To achieve the above purpose, the technical solution of the present invention is as follows.

A capacitive voltage transformer includes: a capacitive voltage-dividing component and an electromagnetic unit. The capacitive voltage-dividing component includes: one or more levels of stacks, each stack is a coupling capacitor, and the coupling capacitor includes: an upper cover plate, a lower cover plate, an insulating sleeve, and a capacitor core. The upper cover plate, the lower cover plate and the insulating sleeve form an accommodating chamber, the accommodating chamber is a closed chamber filled with dielectric oil, and the capacitor core is impregnated in the dielectric oil. It is characterized in that the coupling capacitor further includes:

squirrel cage electrodes respectively arranged between an upper end surface of the capacitor core and the upper cover plate and between a lower end surface of the capacitor core and the lower cover plate, wherein two squirrel cage electrodes arranged at both ends of the capacitor core are used to compress the capacitor core therebetween;

volume matching devices arranged in the squirrel cage electrodes and connected to a breathing regulator on the upper cover plate or the lower cover plate, wherein the volume matching devices are used to compensate for a volume change of the dielectric oil inside;

a high voltage lead arranged in an upper squirrel cage electrode and used for connecting a high-voltage terminal of the capacitor core to a connection terminal of the upper cover plate; and a low voltage lead arranged in a lower squirrel cage electrode and used for connecting a low-voltage terminal of the capacitor core to a connection terminal of the lower cover plate or a low-voltage inner leading-out end of a lead terminal.

The lowermost coupling capacitor is further provided with:

a medium voltage lead arranged in the lower squirrel cage electrode and used for connecting a middle terminal of the capacitor core to a medium-voltage inner leading-out end of the lead terminal; and a lead terminal arranged on the lower cover plate, wherein two ends of the lead terminal extend beyond the lower cover plate, and one end thereof is impregnated in the dielectric oil.

The low voltage lead of the lowermost coupling capacitor is led out through a low-voltage leading-out tube arranged in the lead terminal, and the low-voltage leading-out tube connects the low-voltage inner leading-out end of the lead terminal and a low-voltage outer leading-out end of the lead terminal.

The medium voltage lead of the lowermost coupling capacitor is led out through a medium-voltage leading-out post arranged in the lead terminal. The medium-voltage leading-out post is used for connecting the medium-voltage inner leading-out end of the lead terminal to a medium-voltage outer leading-out end of the lead terminal. The medium-voltage leading-out post passes through and out of the low-voltage leading-out tube and is arranged coaxially with the low-voltage leading-out tube.

The capacitive voltage transformer of the present invention has the following advantages.

First, the squirrel cage electrodes are used to compress and fix the capacitor core, which can reduce the impact on the capacitor core due to vibration caused by transportation or carrying, and shows a significant inhibitory effect on the capacitance change caused by the external temperature variation, thus making the capacitive voltage transformer have more stable capacitance.

Second, the squirrel cage electrodes have a shielding function, which can shield the electric field concentration caused by edges of the volume matching devices, so that the insulation performance of the capacitive voltage transformer is better.

Third, the squirrel cage electrodes can affect the potential distribution of umbrella skirt on the outer surface of the insulating sleeve, so that the electric field strength along the outer surface of umbrella skirt is more uniform, and the insulation reliability of the capacitive voltage transformer is improved.

Fourth, the volume matching devices can be used to effectively compensate for the volume change of the dielectric oil inside caused by temperature variation, ensuring that the capacitive voltage transformer can operate under micro positive pressure in any environment. As such, the decrease of sealing performance due to an excessively high oil pressure inside can be prevented, and the decline of insulation performance caused by a negative pressure inside can be avoided.

Fifth, the volume matching devices are arranged inside the squirrel cage electrodes and do not occupy outside space, which can not only reduce the height of the capacitive voltage transformer, but also enhance its mechanical strength.

Sixth, the upper cover plate, the lower cover plate and the insulating sleeve form a closed space, and the insulating sleeve has an insulation function, as a result, the capacitive voltage transformer is highly standardized and versatile.

Seventh, the squirrel cage electrodes have a shielding function that can shield the electric field concentration caused by the high voltage lead and the low voltage lead, so that the insulation performance of the capacitive voltage transformer is better.

Eighth, the squirrel cage electrode has a shielding function that can shield the electric field concentration caused by the medium-voltage leading-out post, so that the insulation performance of the capacitive voltage transformer is better. Meanwhile, the medium-voltage leading-out post is arranged in the center, and the low-voltage leading-out tube is arranged on the periphery of the medium-voltage leading-out post for shielding the medium-voltage leading-out post, thereby effectively solving the electric field distortion caused when the medium-voltage leading-out post passes through the lower cover plate, and improving the insulation performance and operation reliability of the capacitive voltage transformer.

Based on the above technical solution, the following improvements can be performed.

As a preferred solution, each volume matching device is a corrugated expander. The corrugated expander includes: a corrugated upper part, a gas-retaining part, and a corrugated lower part. The corrugated expander is connected to the breathing regulator on the upper cover plate or the lower cover plate.

Alternatively, each volume matching device includes: an adjustable container and a pressure-adjusting plate that is capable of lifting up and down and is arranged in the adjustable container. The pressure-adjusting plate divides the adjustable container into an oil chamber and a gas chamber. The surface of the oil chamber is provided with a plurality of through holes for the oil chamber to communicate with the accommodating chamber. The gas chamber is filled with gas, and the gas chamber is connected to the breathing regulator on the upper cover plate or the lower cover plate.

Alternatively, each volume matching device is a deformable container. The deformable container: includes a fixed frame and a deformable part arranged on the fixed frame. The deformable container is filled with gas, and the deformable container is connected to the breathing regulator on the upper cover plate or the lower cover plate.

With the above preferred solution, a variety of types of the volume matching device can be used. When the volume matching device is the corrugated expander, the corrugated expander operates with oil outside and gas inside, and compensates for the volume change of the dielectric oil inside the capacitive voltage transformer due to temperature variation through a free contraction or expansion on the breathing regulator. When the volume matching device includes the adjustable container and the pressure-adjusting plate, the position of the pressure-adjusting plate is adjusted by the breathing regulator, so as to compensate for the volume change of the dielectric oil inside the capacitive voltage transformer due to temperature variation. When the volume matching device is the deformable container, the deformation amount of the deformable part is adjusted by the breathing regulator, so as to compensate for the volume change of the dielectric oil inside the capacitive voltage transformer due to temperature variation.

As a preferred solution, outer walls of two ends of the insulating sleeve are sleeved with flanges that are fixedly connected to the upper cover plate or the lower cover plate by fasteners.

With the above preferred solution, the whole capacitive voltage transformer is more stable.

As a preferred solution, the capacitive voltage transformer further includes fastening assemblies arranged at two ends of the insulating sleeve. Each fastening assembly includes:

a positioning plate fixedly arranged on the outer walls of two ends of the insulating sleeve, a fastening plate arranged between the insulating sleeve and the upper cover plate or the lower cover plate. The fastening plate includes:

a pressing part extending into the insulating sleeve and contacting the top or bottom of the squirrel cage electrode; and a connection part fixedly connected to the positioning plate by the fasteners, wherein a length of a portion of the connection part contacting the outer wall of the insulating sleeve in a longitudinal direction is larger than a length of a portion of the pressing part contacting an inner wall of the insulating sleeve in the longitudinal direction.

With the above preferred solution, the fastening plate cooperates with the positioning plate to better compress the squirrel cage electrode and the capacitor core. Moreover, the length of the portion of the connection part contacting the outer wall of the insulating sleeve in the longitudinal direction is larger than the length of the portion of the pressing part contacting the inner wall of the insulating sleeve in the longitudinal direction, which can better prevent the leakage of the dielectric oil.

As a preferred solution, the connection part of the fastening plate is further elastically connected to the positioning plate through an elastic member.

By adopting the above preferred solution, the fastening plate and the positioning plate are matched and installed in a stretched state, and accordingly, the elastic member is in a stretched state. As a result, the pressing part persistently applies a compressing force to the squirrel cage electrode, so that the squirrel cage electrode and the capacitor core are tightly compressed to improve the stability of the capacitive voltage transformer.

As a preferred solution, end portions of two ends of the insulating sleeve contact the fastening plate through elastic gaskets.

With the above preferred solution, the stability of the capacitive voltage transformer is improved.

As a preferred solution, multiple circles of seal grooves are further provided on inner walls of two ends of the insulating sleeve, and seal gaskets are provided in the seal grooves.

With the above preferred solution, the sealing performance is improved, and the leakage of the dielectric oil is prevented.

As a preferred solution, guiding grooves are provided on the inner walls of two ends of the insulating sleeve. Each guiding groove is arranged between two adjacent circles of seal grooves, and the guiding groove is connected to an external transparent tube through a guiding tube.

With the above preferred solution, if the dielectric oil leaks, the external transparent tube will timely display the leakage, so that technicians can perform timely maintenance.

Figure 1:
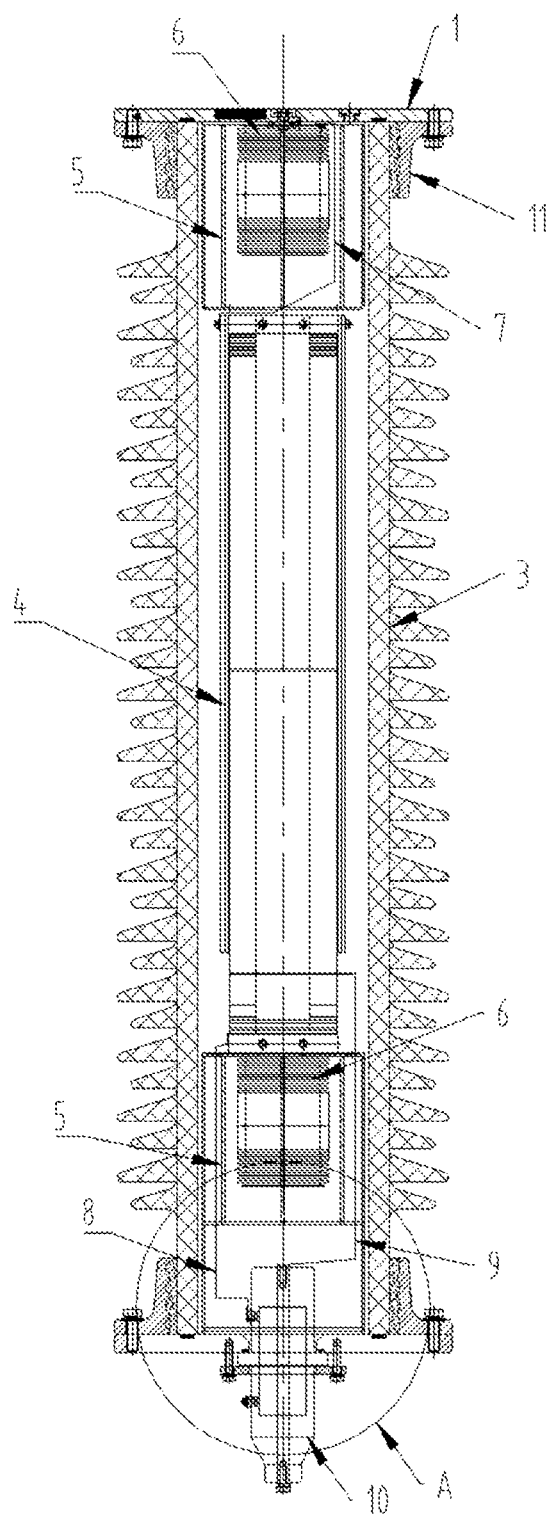
FIG. 1 is a cross-sectional view of the lowermost coupling capacitor provided by an embodiment of the present invention.
Figure 2:
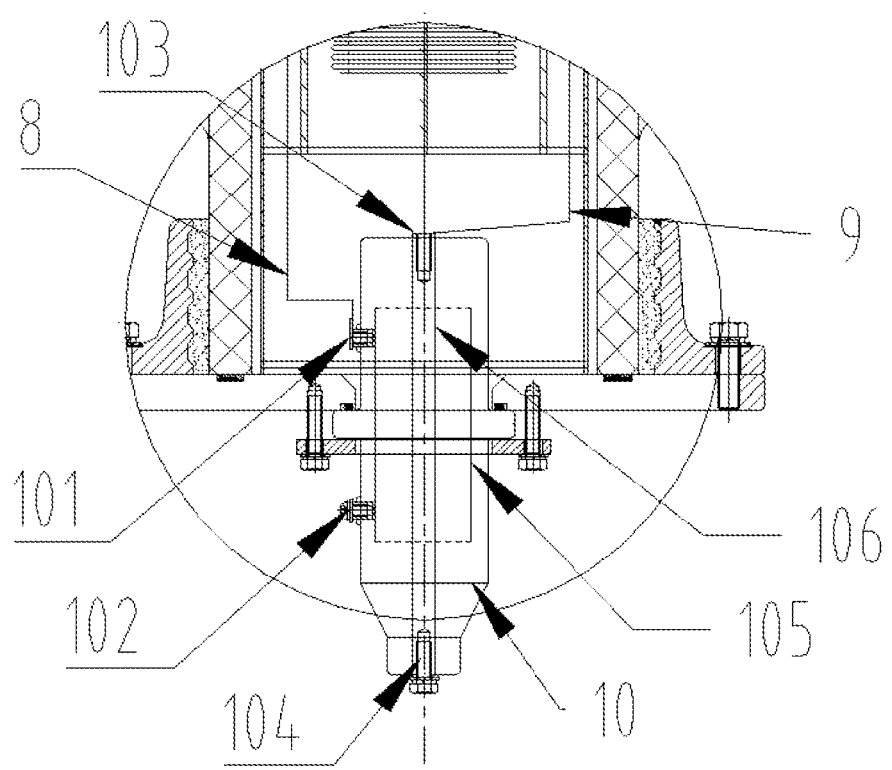
FIG. 2 is a partial enlarged view showing the portion A in FIG. 1.

In the figures, 1—upper cover plate, 2—lower cover plate, 3—insulating sleeve, 4—capacitor core, 5—squirrel cage electrode, 6—volume matching device, 61—corrugated expander, 611—corrugated upper part, 612—gas-retaining part, 613—corrugated lower part, 621—adjustable container, 622—pressure-adjusting plate, 63—deformable container, 631—fixed frame, 632—deformable part, 7—high voltage lead, 8—low voltage lead, 9—medium voltage lead, 10—lead terminal, 101—low-voltage inner leading-out end, 102—low-voltage outer leading-out end, 103—medium-voltage inner leading-out end, 104—medium-voltage outer leading-out end, 105—low-voltage leading-out tube, 106—medium-voltage leading-out post, 11—flange, 12—fastener, 13—positioning plate, 14—fastening plate, 141—pressing part, 142—connection part, 15—elastic member, 16—elastic gasket, 17—seal groove, 18—seal gasket, 19—guiding groove, 20—external transparent tube.

DETAILED DESCRIPTION OF THE EMBODIMENTS

The preferred embodiments of the present invention will be described in detail below with reference to the accompanying drawings.

To achieve the objective of the present invention, in some embodiments, a capacitive voltage transformer is provided as follows. A capacitive voltage transformer includes: a capacitive voltage-dividing component and an electromagnetic unit. The capacitive voltage-dividing component includes: one or more levels of stacks, and each stack is a coupling capacitor. As shown in FIG. 1-FIG. 4, the coupling capacitor includes: the upper cover plate 1, the lower cover plate 2, the insulating sleeve 3, and the capacitor core 4. The upper cover plate 1, the lower cover plate 2 and the insulating sleeve 3 form an accommodating chamber, the accommodating chamber is a closed chamber filled with dielectric oil, and the capacitor core 4 is impregnated in the dielectric oil. The coupling capacitor further includes:

squirrel cage electrodes 5 respectively arranged between an upper end surface of the capacitor core 4 and the upper cover plate 1 and between a lower end surface of the capacitor core 4 and the lower cover plate 2, wherein two squirrel cage electrodes 5 arranged at two ends of the capacitor core 4 are used to compress the capacitor core 4 therebetween;

volume matching devices 6 arranged in the squirrel cage electrodes 5 and connected to a breathing regulator on the upper cover plate 1 or the lower cover plate 2, wherein the volume matching devices are used to compensate for a volume change of the dielectric oil inside;

the high voltage lead 7 arranged in the upper squirrel cage electrode 5 and used for connecting a high-voltage terminal of the capacitor core 4 to a connection terminal of the upper cover plate 1; and the low voltage lead 8 arranged in the lower squirrel cage electrode 5 and used for connecting a low-voltage terminal of the capacitor core 4 to a connection terminal of the lower cover plate 2 or the low-voltage inner leading-out end 101 of the lead terminal 10.

The lowermost coupling capacitor is further provided with:

the medium voltage lead 9 arranged in the lower squirrel cage electrode 5 and used for connecting a middle terminal of the capacitor core 4 to the medium-voltage inner leading-out end 103 of the lead terminal 10; and the lead terminal 10 arranged on the lower cover plate 2, wherein two ends of the lead terminal extend beyond the lower cover plate 2, and one end thereof is impregnated in the dielectric oil.

The low voltage lead 8 of the lowermost coupling capacitor is led out through the low-voltage leading-out tube 105 arranged in the lead terminal 10, and the low-voltage leading-out tube 105 connects the low-voltage inner leading-out end 101 of the lead terminal 10 and the low-voltage outer leading-out end 102 of the lead terminal 10.

The medium voltage lead 9 of the lowermost coupling capacitor is led out through the medium-voltage leading-out post 106 arranged in the lead terminal 10. The medium-voltage leading-out post 106 is used for connecting the medium-voltage inner leading-out end 103 of the lead terminal 10 to the medium-voltage outer leading-out end 104 of the lead terminal 10. The medium-voltage leading-out post 106 passes through and out of the low-voltage leading-out tube 105 and is arranged coaxially with the low-voltage leading-out tube 105.

The low-voltage leading-out tube 105 can be, but is not limited to, an annular cylindrical structure enclosed by a conductive strip.

Further, in order to better prevent leakage across the low-voltage inner leading-out end 101 and the low-voltage outer leading-out end 102, bodies of the low-voltage inner leading-out end 101 and the low-voltage outer leading-out end 102 contact the low-voltage leading-out tube 105.

The medium-voltage leading-out post 106 can be, but is not limited to, a conductive solid cylindrical structure.

The insulating sleeve 3 can be, but is not limited to, a porcelain sleeve.

The capacitive voltage transformer disclosed in the present invention has the following advantages.

First, the squirrel cage electrodes 5 are used to compress and fix the capacitor core 4, which can reduce the impact on the capacitor core 4 due to vibration caused by transportation or carrying, and shows a significant inhibitory effect on the capacitance change caused by the external temperature variation, thus making the capacitive voltage transformer have more stable capacitance.

Second, the squirrel cage electrodes 5 have a shielding function, which can shield the electric field concentration caused by edges of the volume matching devices, so that the insulation performance of the capacitive voltage transformer is better.

Third, the squirrel cage electrodes 5 can affect the potential distribution of umbrella skirt on the outer surface of the insulating sleeve 3, so that the electric field strength along the outer surface of umbrella skirt is more uniform, and the insulation reliability of the capacitive voltage transformer is improved.

Fourth, the volume matching devices 6 can be used to effectively compensate for the volume change of the dielectric oil inside caused by temperature variation, ensuring that the capacitive voltage transformer can operate under micro positive pressure in any environment. As such, the decrease of sealing performance due to an excessively high oil pressure inside can be prevented, and the decline of insulation performance caused by a negative pressure inside can be avoided.

Fifth, the volume matching devices 6 are arranged inside the squirrel cage electrodes and do not occupy outside space, which can not only reduce the height of the capacitive voltage transformer, but also enhance its mechanical strength. Such superiority is especially predominant when the capacitive voltage transformer has a relatively high voltage level (such as: a 1000 kV ultra-high voltage capacitive voltage transformer has a height of 12-15 m and stacks formed by 6-8 coupling capacitors stacked together).

Sixth, the upper cover plate 1, the lower cover plate 2 and the insulating sleeve 3 form a closed space, and the insulating sleeve 3 has an insulation function, as a result, the capacitive voltage transformer is highly standardized and versatile.

Seventh, the squirrel cage electrodes 5 have a shielding function that can shield the electric field concentration caused by the high voltage lead 7 and the low voltage lead 8, so that the insulation performance of the capacitive voltage transformer is better.

Eighth, the squirrel cage electrode 5 has a shielding function that can shield the electric field concentration caused by the medium-voltage leading-out post 106, so that the insulation performance of the capacitive voltage transformer is better. Meanwhile, the medium-voltage leading-out post 106 is arranged in the center, and the low-voltage leading-out tube 105 is arranged on the periphery of the medium-voltage leading-out post 106 for shielding the medium-voltage leading-out post 106, thereby effectively solving the electric field distortion caused when the medium-voltage leading-out post 106 passes through the lower cover plate 2, and improving the insulation performance and operation reliability of the capacitive voltage transformer.

In summary, the capacitive voltage transformer disclosed in the present invention has the advantages of good insulation performance, small partial discharge, excellent sealing performance, dependable performance, high mechanical strength, small product height, long service life, operation stability and reliability and the like.

Figure 4:
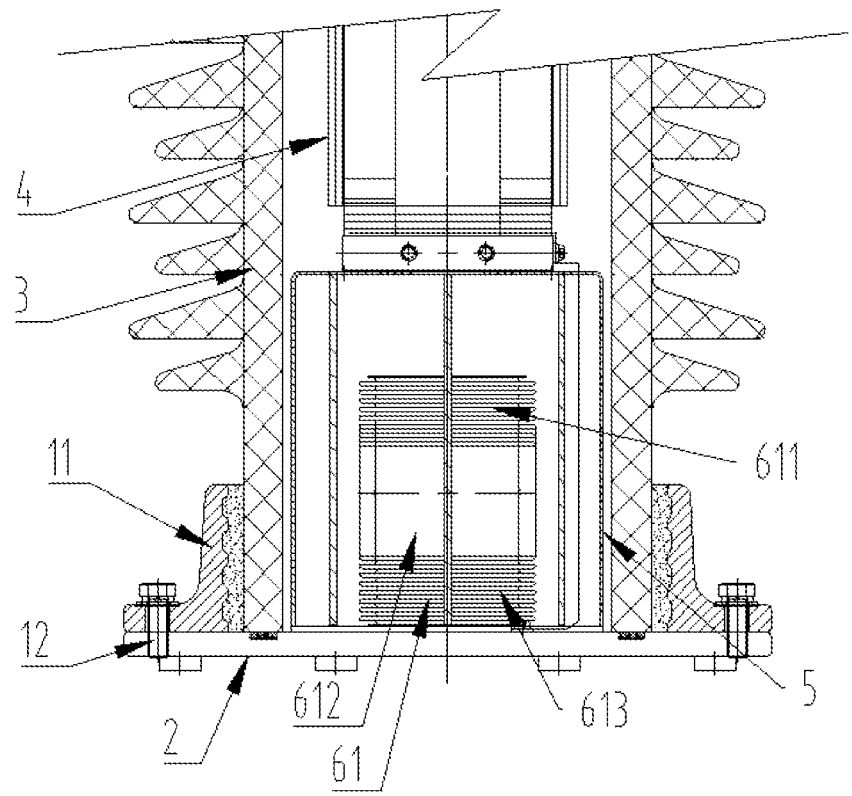
FIG. 4 is a first partial cross-sectional view showing the lower portion of the middle coupling capacitor or the uppermost coupling capacitor provided by an embodiment of the present invention.

As shown in FIG. 4, in order to further optimize the implementation effect of the present invention, in some other embodiments, all the technical features are identical except that the volume matching device 6 is the corrugated expander 61. The corrugated expander 61 includes: the corrugated upper part 611, the gas-retaining part 612, and the corrugated lower part 613. The corrugated expander 61 is connected to the breathing regulator on the upper cover plate 1 or the lower cover plate 2.

When the volume matching device 6 is the corrugated expander 61 in the above preferred solution, the corrugated expander 61 operates with oil outside and gas inside, and compensates for the volume change of the dielectric oil inside the capacitive voltage transformer due to temperature variation through a free contraction or expansion on the breathing regulator.

Figure 5:
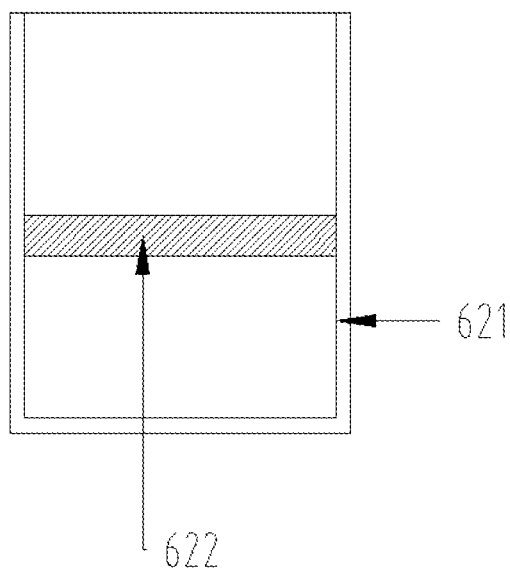
FIG. 5 is a first structural schematic diagram of the volume matching device provided by an embodiment of the present invention.

As shown in FIG. 5, in some other embodiments, the volume matching device 6 includes: the adjustable container 621 and the pressure-adjusting plate 622 that is capable of lifting up and down and is arranged in the adjustable container 621. The pressure-adjusting plate 622 divides the adjustable container 621 into an oil chamber and a gas chamber. The surface of the oil chamber is provided with a plurality of through holes for the oil chamber to communicate with the accommodating chamber. The gas chamber is filled with gas, and the gas chamber is connected to the breathing regulator on the upper cover plate 1 or the lower cover plate 2.

When the volume matching device 6 includes the adjustable container 621 and the pressure-adjusting plate 622 in the above preferred solution, the position of the pressure-adjusting plate 622 is adjusted by the breathing regulator, so as to compensate for the volume change of the dielectric oil inside the capacitive voltage transformer due to temperature variation.

Figure 6:
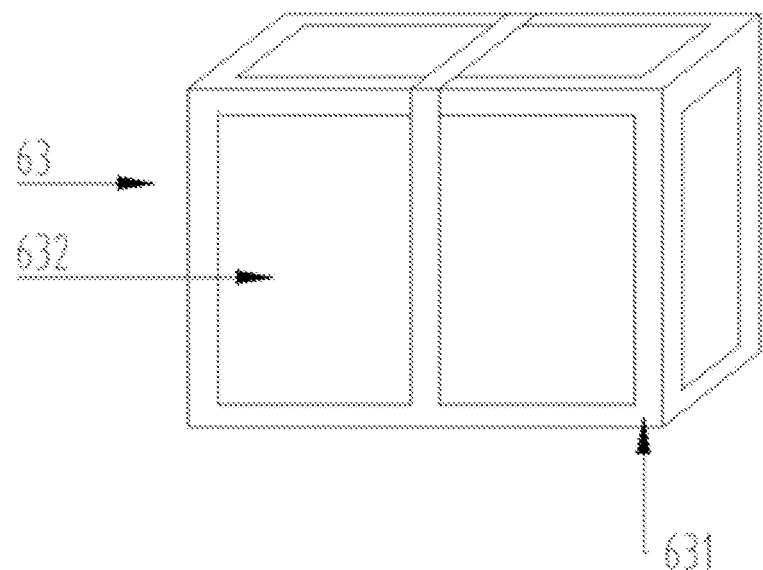
FIG. 6 is a second structural schematic diagram of the volume matching device provided by an embodiment of the present invention.

As shown in FIG. 6, in some other embodiments, the volume matching device is the deformable container 63. The deformable container 63 includes the fixed frame 631 and the deformable part 632 arranged on the fixed frame 631. The deformable container 63 is filled with gas, and the deformable container 63 is connected to the breathing regulator on the upper cover plate 1 or the lower cover plate 2.

When the volume matching device 6 is the deformable container 63 in the above preferred solution, the deformation amount of the deformable part 632 is adjusted by the breathing regulator, so as to compensate for the volume change of the dielectric oil inside the capacitive voltage transformer due to temperature variation.

Figure 3:
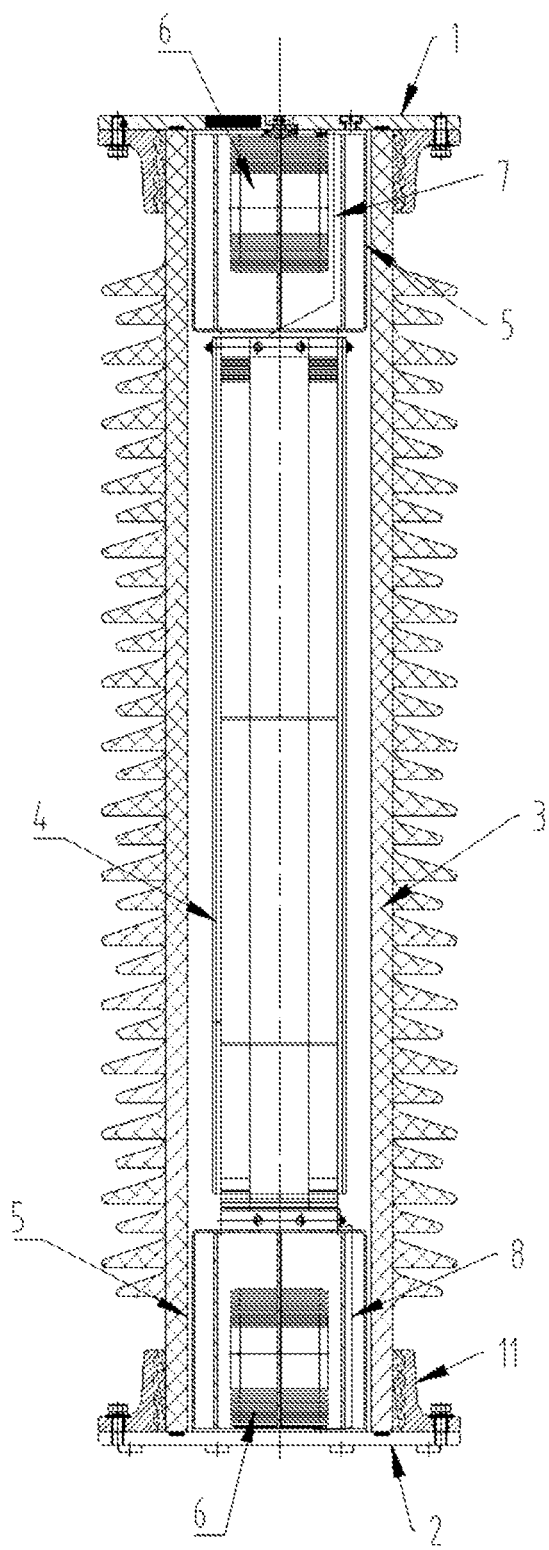
FIG. 3 is a cross-sectional view of the middle coupling capacitor or the uppermost coupling capacitor provided by an embodiment of the present invention.

As shown in FIGS. 1 and 3-4, in order to further optimize the implementation effect of the present invention, in some other embodiments, all the technical features are identical except that the outer walls of two ends of the insulating sleeve 3 are sleeved with the flanges 11 that are fixedly connected to the upper cover plate 1 or the lower cover plate 2 by the fasteners 12.

With the above preferred solution, the whole capacitive voltage transformer is more stable.

Figure 7:
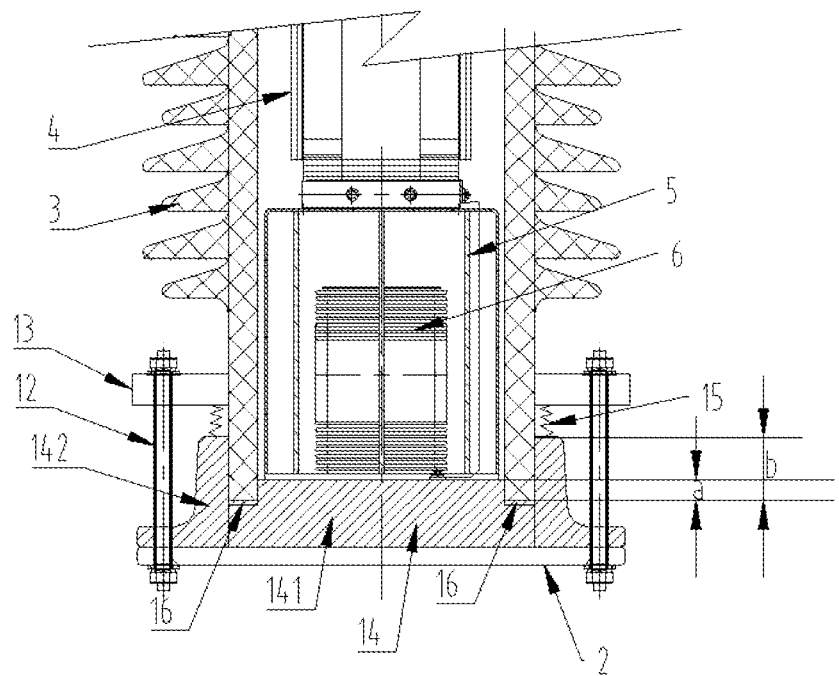
FIG. 7 is a second partial cross-sectional view showing the lower portion of the middle coupling capacitor or the uppermost coupling capacitor provided by an embodiment of the present invention.

As shown in FIG. 7, in order to further optimize the implementation effect of the present invention, in some other embodiments, all the technical features are identical except that the capacitive voltage transformer further includes fastening assemblies arranged at two ends of the insulating sleeve 3. Each fastening assembly includes:

the positioning plate 13 fixedly arranged on the outer walls of two ends of the insulating sleeve 3, the fastening plate 14 arranged between the insulating sleeve 3 and the upper cover plate 1 or the lower cover plate 2. The fastening plate 14 includes:

the pressing part 141 extending into the insulating sleeve 3 and contacting the top or bottom of the squirrel cage electrode 5; and the connection part 142 fixedly connected to the positioning plate 13 by the fasteners 12, wherein the portion of the connection part 142 contacting the outer wall of the insulating sleeve 3 has the length of b in the longitudinal direction, which is larger than the length a of the portion of the pressing part 141 contacting the inner wall of the insulating sleeve 3 in the longitudinal direction.

With the above preferred solution, the fastening plate 14 cooperates with the positioning plate 13 to better compress the squirrel cage electrode 5 and the capacitor core 4. Moreover, the length of the portion of the connection part 142 contacting the outer wall of the insulating sleeve 3 in the longitudinal direction is larger than the length of the portion of the pressing part 141 contacting the inner wall of the insulating sleeve 3 in the longitudinal direction, which can better prevent the leakage of the dielectric oil.

As shown in FIG. 7, the connection part 142 of the fastening plate 14 is further elastically connected to the positioning plate 13 through the elastic member 15.

By adopting the above preferred solution, the fastening plate 14 and the positioning plate 13 are matched and installed in a stretched state, and accordingly, the elastic member 15 is in a stretched state. As a result, the pressing part 141 persistently applies a compressing force to the squirrel cage electrode 5, so that the squirrel cage electrode 5 and the capacitor core 4 are tightly compressed to improve the stability of the capacitive voltage transformer.

Further, the end portions of two ends of the insulating sleeve 3 contact the fastening plate 14 through the elastic gaskets 16.

With the above preferred solution, the stability of the capacitive voltage transformer is improved.

Figure 8:
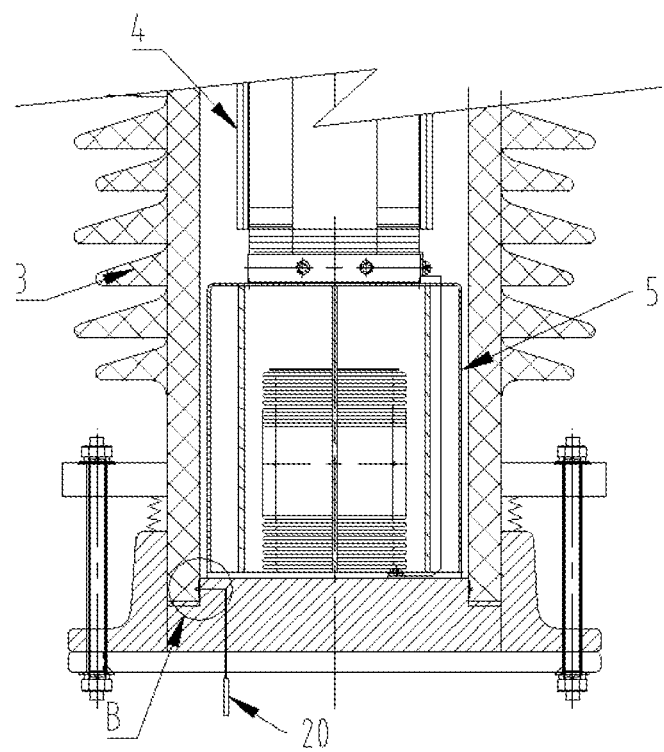
FIG. 8 is a third partial cross-sectional view showing the lower portion of the middle coupling capacitor or the uppermost coupling capacitor provided by an embodiment of the present invention.
Figure 9:
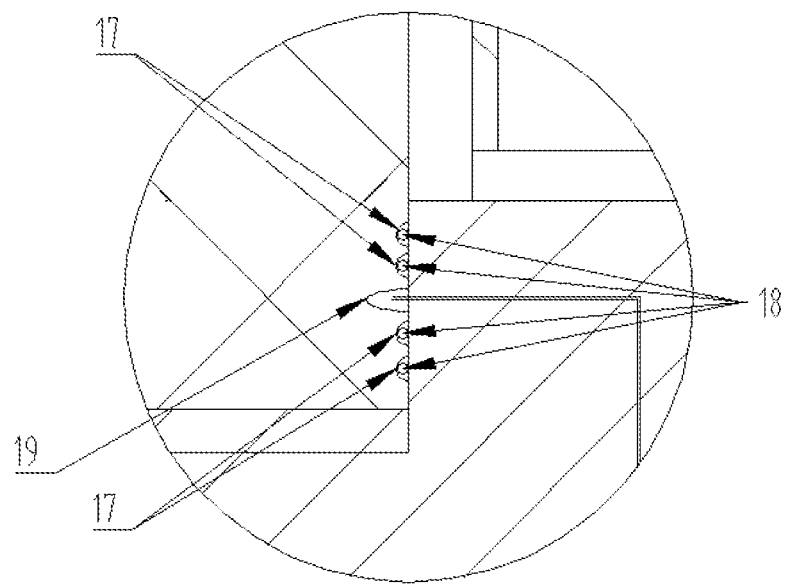
FIG. 9 is a partial enlarged view showing the portion B in FIG. 8.

As shown in FIGS. 8-9, multiple circles of seal grooves 17 are further provided on the inner walls of two ends of the insulating sleeve 3, and the seal gaskets 18 are provided in the seal grooves 17.

With the above preferred solution, the sealing performance is improved, and the leakage of the dielectric oil is prevented.

As shown in FIGS. 8-9, the guiding grooves 19 are further provided on the inner walls of two ends of the insulating sleeve 3. Each guiding groove 19 is arranged between two adjacent circles of seal grooves 17, and the guiding groove 19 is connected to the external transparent tube 20 through a guiding tube.

With the above preferred solution, if the dielectric oil leaks, the external transparent tube 20 will timely display the leakage, so that technicians can perform timely maintenance.

The above multiple implementations can be realized crosswise or in parallel.

For the preferred embodiments of the present invention, it should be pointed out that for those of ordinary skills in the art, several modifications and improvements can be made without departing from the inventive concept of the present invention, which all fall within the protection scope of the present invention.

The invention claimed is:

1. A capacitive voltage transformer, comprising: a capacitive voltage-dividing component and an electromagnetic unit, wherein the capacitive voltage-dividing component comprises: one or more levels of stacks, each of the stacks is a coupling capacitor, the coupling capacitor comprises: an upper cover plate, a lower cover plate, an insulating sleeve, and a capacitor core, the upper cover plate, the lower cover plate and the insulating sleeve form an accommodating chamber, the accommodating chamber is a closed chamber filled with dielectric oil, and the capacitor core is impregnated in the dielectric oil, wherein the coupling capacitor further comprises:
    squirrel cage electrodes respectively arranged between an upper end surface of the capacitor core and the upper cover plate and between a lower end surface of the capacitor core and the lower cover plate, wherein two squirrel cage electrodes arranged at two ends of the capacitor core are configured to compress the capacitor core between the two squirrel cage electrodes;
    volume matching devices arranged in the squirrel cage electrodes and connected to a breathing regulator on the upper cover plate or the lower cover plate, wherein the volume matching devices are configured to compensate for a volume change of the dielectric oil inside;
    a high voltage lead arranged in an upper squirrel cage electrode and configured for connecting a high-voltage terminal of the capacitor core to a connection terminal of the upper cover plate; and
    a low voltage lead arranged in a lower squirrel cage electrode and configured for connecting a low-voltage terminal of the capacitor core to a connection terminal of the lower cover plate or a low-voltage inner leading-out end of a lead terminal;
    a lowermost coupling capacitor is further provided with:
    a medium voltage lead arranged in the lower squirrel cage electrode and configured for connecting a middle terminal of the capacitor core to a medium-voltage inner leading-out end of the lead terminal; and
    the lead terminal arranged on the lower cover plate, wherein two ends of the lead terminal extend beyond the lower cover plate, and one end of the lead terminal is impregnated in the dielectric oil;
    the low voltage lead of the lowermost coupling capacitor is led out through a low-voltage leading-out tube arranged in the lead terminal, and the low-voltage leading-out tube connects the low-voltage inner leading-out end of the lead terminal and a low-voltage outer leading-out end of the lead terminal;
    the medium voltage lead of the lowermost coupling capacitor is led out through a medium-voltage leading-out post arranged in the lead terminal, the medium-voltage leading-out post is configured for connecting the medium-voltage inner leading-out end of the lead terminal to a medium-voltage outer leading-out end of the lead terminal, and the medium-voltage leading-out post passes through and out of the low-voltage leading-out tube and is arranged coaxially with the low-voltage leading-out tube.

2. The capacitive voltage transformer according to claim 1, wherein each of the volume matching devices is a corrugated expander, the corrugated expander comprises: a corrugated upper part, a gas-retaining part, and a corrugated lower part, the corrugated expander is connected to the breathing regulator on the upper cover plate or the lower cover plate;
    alternatively, each of the volume matching devices comprises: an adjustable container and a pressure-adjusting plate that is capable of lifting up and down and is arranged in the adjustable container, the pressure-adjusting plate divides the adjustable container into an oil chamber and a gas chamber, a surface of the oil chamber is provided with a plurality of through holes for the oil chamber to communicate with the accommodating chamber, the gas chamber is filled with gas, and the gas chamber is connected to the breathing regulator on the upper cover plate or the lower cover plate;
    alternatively, each of the volume matching devices is a deformable container, the deformable container comprises: a fixed frame and a deformable part arranged on the fixed frame, the deformable container is filled with gas, and the deformable container is connected to the breathing regulator on the upper cover plate or the lower cover plate.

3. The capacitive voltage transformer according to claim 2, wherein outer walls of two ends of the insulating sleeve are sleeved with flanges, and the flanges are fixedly connected to the upper cover plate or the lower cover plate by fasteners.

4. The capacitive voltage transformer according to claim 3, further comprising: fastening assemblies arranged at two ends of the insulating sleeve, wherein each of the fastening assemblies comprises:
- a positioning plate fixedly arranged on the outer walls of the two ends of the insulating sleeve,
- a fastening plate arranged between the insulating sleeve and the upper cover plate or the lower cover plate, wherein the fastening plate comprises:
- a pressing part extending into the insulating sleeve and contacting a top or bottom of the squirrel cage electrode; and
- a connection part fixedly connected to the positioning plate by the fasteners, wherein a length of a portion of the connection part contacting the outer wall of the insulating sleeve in a longitudinal direction is larger than a length of a portion of the pressing part contacting an inner wall of the insulating sleeve in the longitudinal direction.

5. The capacitive voltage transformer according to claim 4, wherein the connection part of the fastening plate is further elastically connected to the positioning plate through an elastic member.

6. The capacitive voltage transformer according to claim 5, wherein end portions of the two ends of the insulating sleeve contact the fastening plate through elastic gaskets.

7. The capacitive voltage transformer according to claim 6, wherein multiple circles of seal grooves are further provided on inner walls of the two ends of the insulating sleeve, and seal gaskets are provided in the seal grooves.

8. The capacitive voltage transformer according to claim 7, wherein guiding grooves are provided on the inner walls of the two ends of the insulating sleeve, each of the guiding grooves is arranged between two adjacent circles of seal grooves, and each of the guiding grooves is connected to an external transparent tube through a guiding tube.

* * * * *